United States Patent [19]

Melnick

[11] 4,113,978

[45] Sep. 12, 1978

[54] EVAPORATION SOURCE FOR VACUUM DEPOSITION

[75] Inventor: Igor Melnick, Grenoble, France

[73] Assignee: Commissariat a l'Energie Atomique, Paris, France

[21] Appl. No.: 797,849

[22] Filed: May 17, 1977

[30] Foreign Application Priority Data

May 24, 1976 [FR] France .................. 76 15684

[51] Int. Cl.² .......................... H05B 3/10
[52] U.S. Cl. ..................... 13/22; 219/275; 219/424
[58] Field of Search .............. 13/20, 22, 25, 31; 219/424, 420, 275

[56] References Cited

U.S. PATENT DOCUMENTS 3,430,937  3/1969  Spitzer ................... 219/275
3,514,575  5/1970  Hall et al. ............. 219/424 X

FOREIGN PATENT DOCUMENTS 1,389,582  1/1964  France ...................... 13/22

Primary Examiner—R. N. Envall, Jr.
Attorney, Agent, or Firm—Cameron, Kerkam, Sutton, Stowell & Stowell

[57] ABSTRACT

Evaporation source for vacuum deposition, comprising a refractory crucible provided in its outer surface with conducting members traversed by an electric current and able to raise the crucible temperature by Joule effect, in which the said outer surface is coated, prior to fitting the conducting members, with a thin intermediate coating layer which does not react with the crucible but which is in intimate contact with the latter.

A particular application is the vacuum heating to elevated temperature of crucibles.

4 Claims, 1 Drawing Figure

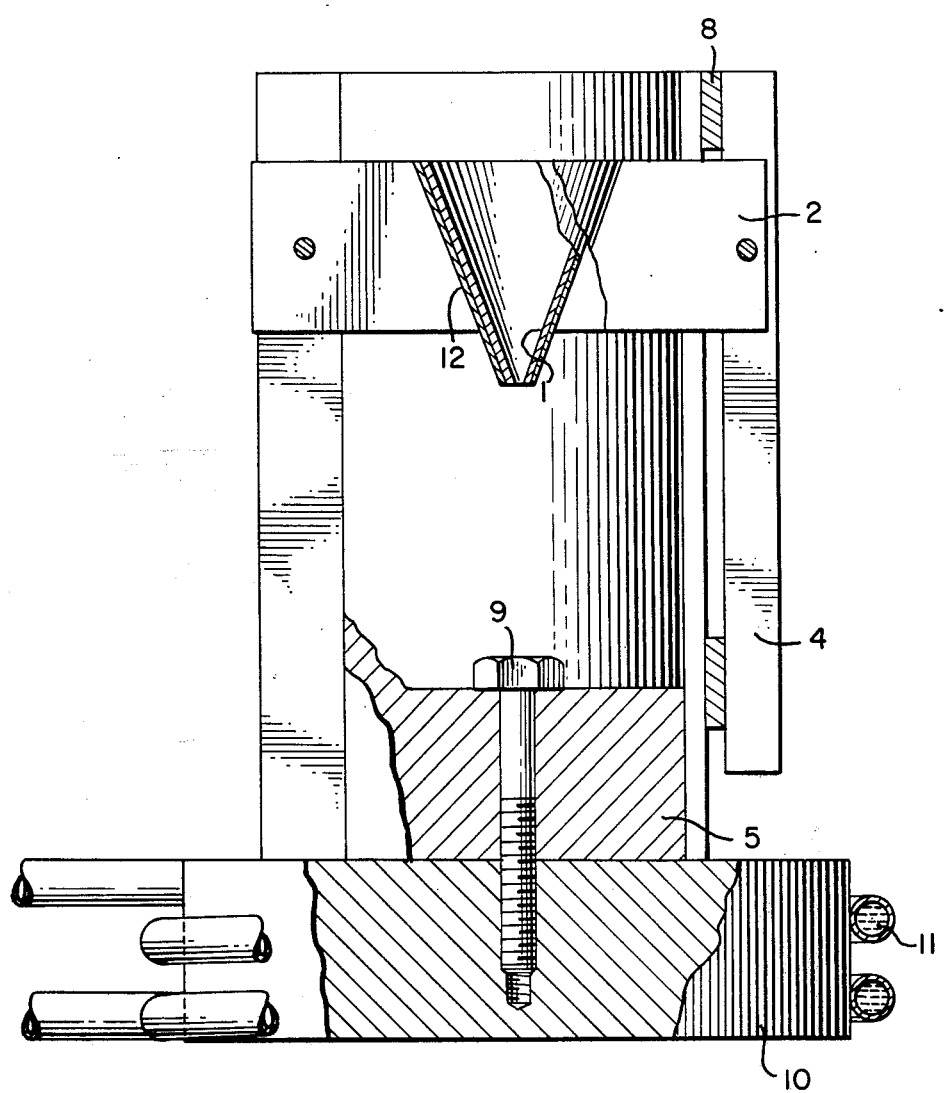

EVAPORATION SOURCE FOR VACUUM DEPOSITION

BACKGROUND OF THE INVENTION

The present invention relates to high temperature vacuum heating of crucibles, for example, for vacuum evaporation.

Numerous constructions of sources of devices are already known which are suitable for effecting vacuum evaporation of a body heated to high temperature, said sources generally comprising a refractory crucible of suitable shape containing the body to be evaporated, which is normally a metallic product. The crucible temperature is raised by means of electrical resistance units applied to the outer surface of the crucible. In conventional solutions, the crucible is made from a ceramic material, preferably beryllium oxide, and the electrical resistance units comprise tantalum members fixed to the crucible and connected to a power supply, whereby a heat release takes place in these members by Joule effect. In particular, and as described in French Pat. No. 1,389,582, in the name of the Commissariat a l'Energie Atomique, the crucible advantageously has a conical shape and the heating elements associated with the crucible comprise a metal strip shaped to precisely follow the crucible profile so as to be in contact with the entire outer surface thereof, thus bringing about an adequate coupling and preventing a non-homogeneous distribution of the heat produced and mechanical stresses in the crucible thickness.

However, in constructions of this type, experience has shown that there is a disadvantage, particularly in the case where the temperature necessary for evaporating the body or metallic product contained in the crucible exceeds 1600° C. Under such conditions, a reaction takes place between the tantalum of the resistance unitsand the beryllium oxide of the crucible, which considerably limits the service life of the latter, whereby the service life decreases as the temperature increases. Moreover, at such a temperature, particularly in the case where the crucible contains molten aluminium, the latter diffuses through the crucible wall and forms with the tantalum of the resistance unitsan alloy, whose melting point is lower, thus causing the destruction of the resistance units. In general, even under the best conditions, the service life of the crucible would not significantly exceed 5 minutes.

BRIEF SUMMARY OF THE INVENTION

The object of the present invention is an evaporation source for vacuum deposition which obviates this disadvantage and makes it possible to obtain a significantly increased service life, which exceeds two hours under the same conditions of use.

To this end, the evaporation source in question comprises a refractory crucible whose outer surface has conducting members traversed by an electric current and which are able to raise the crucible temperature by Joule effect, said outer surface being coated, prior to the fitting of the conducting members with a thin intermediate coating layer which does not react with the crucible, but is in intimate contact with the latter.

According to a preferred embodiment of the invention, the crucible is made from beryllium oxide and the conducting members from tantalum, whilst the intermediate layer is formed from molybdenum or tungsten. According to a special feature, the thin intermediate layer has a thickness between 5 and 500 microns.

The thin intermediate layer of molybdenum or tungsten can be applied to the outer surface of the crucible by any known process. Advantageously, this thin layer is deposited by a metal spraying process.

Accompanying drawing shows a preferred embodiment of the present invention.

DETAILED DESCRIPTION OF PREFERRED EMBODIMENTS

The production of a refractory curcible provided with such an intermediate protective layer 12 makes it possible to use a conventional crucible 1, made more particularly from beryllium oxide or glucina and tantalum resistance units 2 in close contact with the crucible wall, whereby the service life of the latter is increased from 5 minutes to more than 2 hours at 1600° C. Units 2 connect to electric terminals 4 which are insulated at 8 from cylindrical pot 5 securedat 9 to base 10 which is water cooled at 11.

This improvement results from several considerations. Firstly, the molybdenum or tungsten of the intermediate layer will only react with the beryllium oxide as from a minimum of about 1900° C., which shows that in the temperature range used, said intermediate layer behaves like an insulating barrier preventing harmful reactions between the crucible and the resistance units. Secondly, it is found that the thermal conductivity of the beryllium oxide passes from 0.52 cal./cm/cm$^2$/ ° C./sec. at 0° C. to 0.03 cal./cm/cm$^2$/° C./sec. at 1600° C., whilst at the same time, molybdenum has a thermal conductivity of 0.22 cal./cm/cm$^2$/° C./sec. at 1600° C. Thus, the higher conductivity of molybdenum makes it possible to avoid hot spots between the tantalum members and the beryllium oxide of the crucible and to heat the latter in a more homogeneous manner.

The invention is not limited to the embodiments described hereinbefore and various modifications can be made thereto without passing beyond the scope of the invention.

What is claimed is:

1. An evaporation source for vacuum deposition, comprising a refractory crucible provided in its outer surface with conducting members traversed by an electric current and able to raise the crucible temperature by Joule effect, wherein the said outer surface is coated, prior to fitting the conducting members, with a thin intermediate coating layer which does not react with the crucible but which is in intimate contact with the latter and wherein the crucible is beryllium oxide and the intermediate layer is selected from the group consisting of molybdenum and tungsten.

2. An evaporation source according to claim 1 wherein the conducting members are tantalum.

3. An evaporation source according to claim 1, wherein the thin intermediate layer has a thickness between 5 and 500 microns.

4. An evaporation source according to claim 1, wherein the thin layer is a metal spray.